(12) United States Patent
Lee et al.

(10) Patent No.: US 11,258,002 B2
(45) Date of Patent: Feb. 22, 2022

(54) THERMOELECTRIC SINTERED BODY AND THERMOELECTRIC ELEMENT

(71) Applicant: LG INNOTEK CO., LTD., Seoul (KR)

(72) Inventors: Seung Yong Lee, Seoul (KR); Chang Eun Kim, Seoul (KR); Jin Suk Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 137 days.

(21) Appl. No.: 16/477,235

(22) PCT Filed: Jan. 24, 2018

(86) PCT No.: PCT/KR2018/001049
§ 371 (c)(1),
(2) Date: Jul. 11, 2019

(87) PCT Pub. No.: WO2018/143598
PCT Pub. Date: Aug. 9, 2018

(65) Prior Publication Data
US 2021/0135079 A1 May 6, 2021

(30) Foreign Application Priority Data

Feb. 1, 2017 (KR) .................. 10-2017-0014610
Dec. 20, 2017 (KR) .................. 10-2017-0176190

(51) Int. Cl.
*H01L 35/26* (2006.01)
*B22F 3/16* (2006.01)
(Continued)

(52) U.S. Cl.
CPC ............... *H01L 35/26* (2013.01); *B22F 3/16* (2013.01); *H01L 35/32* (2013.01); *H01L 35/34* (2013.01); *B22F 2304/15* (2013.01)

(58) Field of Classification Search
CPC ......... H01L 35/26; H01L 35/32; H01L 35/34; H01L 35/08; H01L 35/16; B22F 3/16; B22F 2304/15; B22F 1/0007; B22F 7/08
See application file for complete search history.

(56) References Cited

U.S. PATENT DOCUMENTS

2011/0198541 A1* 8/2011 Murai ................... H01L 35/26
252/500
2012/0024333 A1* 2/2012 Lee ...................... C04B 35/645
136/205

(Continued)

FOREIGN PATENT DOCUMENTS

JP    2003-246678        9/2003
JP    2003246678 A  *    9/2003
(Continued)

OTHER PUBLICATIONS

JP-2003246678-A, Funahashi, Machine Translation (Year: 2003).*
(Continued)

*Primary Examiner* — Devina Pillay
(74) *Attorney, Agent, or Firm* — Ked & Associates, LLP (57) ABSTRACT

A thermoelectric sintered body according to an embodiment comprises thermoelectric powder, the thermoelectric powder, arranged in a horizontal direction, comprising: a plurality of first powders in the shape of plate-type flakes; and a plurality of second powders in a shape different from that of the first powders, wherein the second powders comprise 5 volume % or less of the total thermoelectric powder.

14 Claims, 6 Drawing Sheets

(51) Int. Cl.
  *H01L 35/32* (2006.01)
  *H01L 35/34* (2006.01)

(56) References Cited

U.S. PATENT DOCUMENTS

| | | |
|---|---|---|
| 2013/0221290 A1 | 8/2013 | Murai et al. |
| 2014/0170794 A1 | 6/2014 | Ota et al. |
| 2016/0197256 A1* | 7/2016 | Choi .................. H01L 35/34 |
| | | 252/519.13 |
| 2016/0293820 A1 | 10/2016 | Tohei et al. |

FOREIGN PATENT DOCUMENTS

| | | |
|---|---|---|
| JP | 2003-306381 | 10/2003 |
| JP | 2016-063006 | 4/2016 |
| KR | 10-2016-0043828 | 4/2016 |
| KR | 10-2016-0118599 | 10/2016 |
| KR | 20160118599 A * | 10/2016 |
| WO | WO 2012/063110 | 5/2012 |

OTHER PUBLICATIONS

Choi, KR-20160118599-A, Machine Translation (Year: 2016).*
International Search Report (with English Translation) and Written Opinion dated May 17, 2018 issued in Application No. PCT/KR2018/001049.
European Search Report dated Sep. 29, 2020 issued in Application No. 18747444.0.

* cited by examiner

THERMOELECTRIC SINTERED BODY AND THERMOELECTRIC ELEMENT

CROSS-REFERENCE TO RELATED PATENT APPLICATIONS

This application is a U.S. National Stage Application under 35 U.S.C. § 371 of PCT Application No. PCT/KR2018/001049, filed Jan. 24, 2018, which claims priority to Korean Patent Application No. 10-2017-0014610, filed Feb. 1, 2017, and Korean Patent Application No. 10-2017-0176190, filed Dec. 20, 2017, whose entire disclosures are hereby incorporated by reference.

TECHNICAL FIELD

An embodiment relates to a thermoelectric sintered body and a thermoelectric element.

BACKGROUND ART

A thermoelectric phenomenon is a phenomenon generated by movement of electrons and holes in a material, and refers to a direct energy conversion between heat and electricity.

A thermoelectric element generally refers to an element using the thermoelectric phenomenon, and has a structure in which a P-type thermoelectric material and an N-type thermoelectric material are bonded between metal electrodes to form a PN junction pair.

Thermoelectric elements may be classified into an element using temperature change of an electric resistor, an element using a Seebeck effect, which is a phenomenon in which an electromotive force is generated by a temperature difference, an element using a Peltier effect, which is a phenomenon in which heat is absorbed or generated by a current, and the like.

Thermoelectric elements are widely applied to home appliances, electronic parts, communication parts, and the like. For example, the thermoelectric elements may be applied to a cooling device, a heating device, a power generation device, and the like. Accordingly, the demand for thermoelectric performance of the thermoelectric element is gradually increasing.

Such thermoelectric performance may be related to a thermoelectric leg constituting a thermoelectric element, and in detail, to a thermoelectric sintered body constituting the thermoelectric leg.

Therefore, it is required to manufacture a thermoelectric sintered body capable of improving thermoelectric performance.

DISCLOSURE

Technical Problem

An embodiment is directed to providing a thermoelectric sintered body and a thermoelectric element having improved uniformity and efficiency.

Technical Solution

A thermoelectric sintered body according to an embodiment includes thermoelectric powder, wherein the thermoelectric powder is disposed in the horizontal direction and includes a plurality of first powders having a plate-like flake shape and a plurality of second powders different in shape from the first powders, and the second powders are included at 5 vol % or less of the entire thermoelectric powder.

Advantageous Effects

In thermoelectric powder sintered body manufactured by a thermoelectric powder sintered body manufacturing apparatus according to an embodiment, an arrangement of powder of the thermoelectric powder sintered body may be disposed mostly in one direction. That is, the arrangement of the powders may be disposed in one direction of the horizontal direction.

Accordingly, thermal conductivity of the thermoelectric powder sintered body may be reduced, and electrical conductivity may be improved, and accordingly, when the thermoelectric powder sintered body is applied to a thermoelectric leg of a thermoelectric element, thermoelectric performance of the thermoelectric leg may be improved.

In addition, since it is possible to reduce a ball-shaped thermoelectric powder that causes a decrease in electrical conductivity in a thermoelectric powder control unit, the thermoelectric performance of the thermoelectric leg may be improved.

MODES OF THE INVENTION

While the present invention is susceptible to various modifications and may take on various alternative forms, specific embodiments thereof are shown by way of example in the drawings and will be described herein in detail. However, it should be understood that there is no intent to limit the present invention to the particular forms disclosed. On the contrary, the present invention is to cover all modifications, equivalents, and alternatives falling within the spirit and scope of the claims.

It should be understood that, although the terms first, second, and the like may be used herein to describe various elements, these elements are not limited by these terms. The terms are only used to distinguish one element from another. For example, a first element could be termed a second element without departing from the scope of the present invention, and a second element could similarly be termed a first element. As used here, the term "and/or" includes any and all combinations of one or more of the associated listed items.

It should be understood that, when an element is referred to as being "connected" or "coupled" to another element, the element may be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It should be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art and are not to be interpreted in an idealized or overly formal sense unless expressly so defined here.

Hereinafter, exemplary embodiments will be described in detail with reference to the accompanying drawings. The same or corresponding elements are denoted by the same reference numerals regardless of drawings, and repeated descriptions thereof will be omitted.

Hereinafter, a thermoelectric sintered body manufacturing apparatus according to an embodiment will be described with reference to FIGS. 1 and 2.

Figure 1:
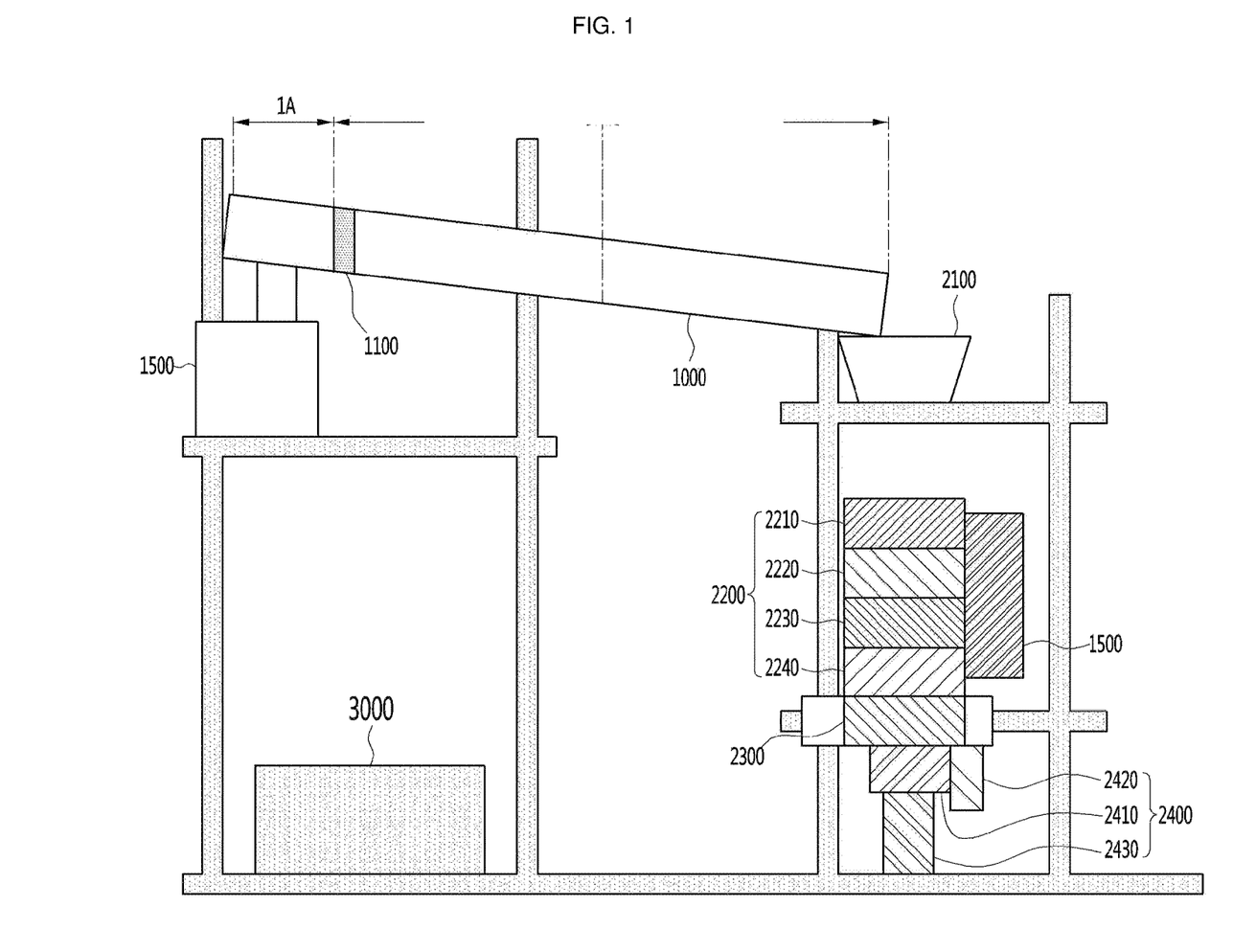
FIG. 1 is a view illustrating a thermoelectric sintered body manufacturing apparatus according to an embodiment.
Figure 2:
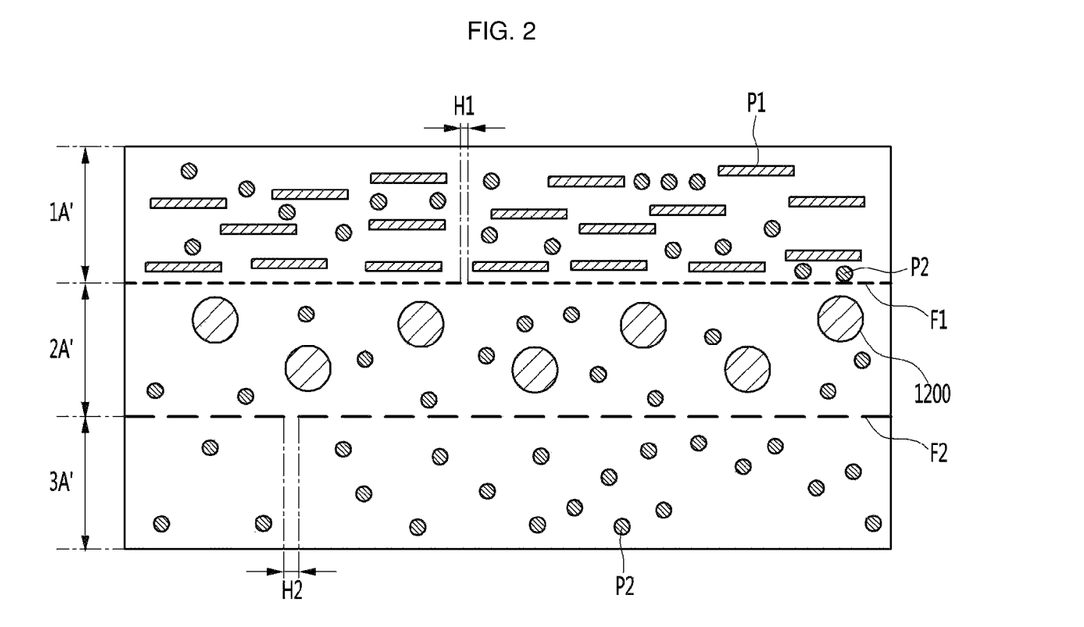
FIG. 2 is a cross-sectional view of a control region of a thermoelectric sintered body manufacturing apparatus according to an embodiment.

Referring to FIGS. 1 and 2, a thermoelectric sintered body manufacturing apparatus according to an embodiment may include a powder control unit 1000 and a powder sintering unit 2000.

The powder control unit 1000 may be a thermoelectric powder control device. In addition, the powder sintering unit 2000 may be a thermoelectric powder sintering apparatus.

The powder control unit 1000 and the powder sintering unit 2000 may be connected to each other. In detail, the powder control unit 1000 may control a particle size and concentration of a powder, and the controlled powder may be moved to the powder sintering unit 2000 to be sintered.

The powder control unit 1000 and the powder sintering unit 2000 may be detachably connected to each other. For example, the powder control unit 1000 and the powder sintering unit 2000 may be used as independent devices, or the powder control unit 1000 and the powder sintering unit 2000 may be combined with each other to be used as a single device.

The powder control unit 1000 may include a plurality of regions. For example, the powder control unit 1000 may include an input region 1A, a control region 2A, and a supply region 3A.

Thermoelectric powder may be provided in the input region 1A. For example, the thermoelectric powder may be powder for manufacturing a thermoelectric leg of a thermoelectric element.

For example, the thermoelectric powder may be milled with a doping additive. For example, ribbon-shaped powder and the doping additive may be mixed by using a super mixer, a ball mill, an attrition mill, a 3-roll mill, or the like.

The thermoelectric powder may contain Bi, Te and Se. In addition, the doping additive may contain Cu and Bi2O3. In this case, a thermoelectric material containing Bi, Te and Se may be milled after being added at a composition ratio of 99.4 to 99.98 wt %, 0.01 to 0.1 wt % of Cu, and 0.01 to 0.5 wt % of Bi2O3. Preferably, the thermoelectric material containing Bi, Te and Se may be milled after being added at a composition ratio of 99.48 to 99.98 wt %, of 0.01 to 0.07 wt % of Cu, and 0.01 to 0.45 wt % of Bi2O3. And more preferably, the thermoelectric material containing Bi, Te and Se may be milled after being added at a composition ratio of 99.67 to 99.98 wt %, 0.01 to 0.03 wt % of Cu, and 0.01 to 0.30 wt % of Bi2O3.

The input region 1A and the control region 2A may be separated from each other. In detail, a gate 1100 may be disposed between the input region 1A and the control region 2A, and the input region 1A and the control region 2A may be separated from each other by the gate 1100.

The gate 1100 may be opened and closed by an external controller 3000. In detail, when the thermoelectric powder is inputted into the input region 1A, the gate 1100 may be kept closed, and accordingly, the input region 1A and the control region 2A may be separated from each other.

Subsequently, after all the thermoelectric powder is inputted into the input region 1A, the gate 1100 may be opened by the external controller 3000. That is, the thermoelectric powder inputted into the input region 1A may move in the direction of the control region 2A by opening the gate 1100.

Referring to FIG. 2, the control region 2A may include a first 'region 1A', a second 'region 2A', and a third 'region 3A'.

The first 'region 1A', the second 'region 2A', and the third 'region 3A' may be disposed in a layered structure. In detail, the second 'region 2A' may be disposed on the third 'region 3A', and the first 'region 1A' may be disposed on the second 'region 2A'. That is, the second 'region 2A' may be disposed between the first 'region 1A' and the third 'region 3A'.

A first filter portion F1 may be disposed between the first 'region 1A' and the second 'region 2A'. In addition, a second filter portion F2 may be disposed between the second 'region 2A' and the third 'region 3A'.

The first filter portion F1 and the second filter portion F2 may include a plurality of holes. For example, the first filter portion F1 may include first holes H1. In addition, the second filter portion F2 may include second holes H2.

The first hole H1 and the second hole H2 may be formed in a size different from each other. In detail, a size of the first hole H1 may be smaller than that of the second hole H2. That is, the size of the second hole H2 may be larger than that of the first hole H1.

The sizes of the first hole H1 and the second hole H2 may be controlled to an appropriate size for separating the thermoelectric powder including powder having a different particle size and shape. For example, the sizes of the first hole H1 and the second hole H2 may be smaller than a size of a first powder described below, and may be larger than a size of a second powder.

For example, the size of the first hole H1 may be about 1100 μm or more. More specifically, the size of the first hole H1 may be about 1100 μm to about 1500 μm. In addition, the size of the second hole H2 may be about 1500 μm or more. In detail, the size of the second hole H2 may be about 1500 μm to 2000 μm.

In addition, a vibration portion 1200 may be disposed in the second 'region 2A'. The vibration portion 1200 may transmit a vibration applied by an external control member 3000 to the first filter portion F1 and the second filter portion F2.

The vibration portion 1200 may be formed in a spherical shape, a bar shape, or a polygonal shape. For example, the vibration portion 1200 may include a spherical silicon ball or the like.

The thermoelectric powder injected through the input region 1A may be moved to the first 'region 1A'. The powder injected through the input region 1A may include a first powder P1 and a second powder P2.

In detail, the thermoelectric powder injected through the input region 1A may include the first powder P1 and the second powder P2 having different shapes. In detail, the first powder P1 may be formed in a ribbon shape, that is, a plate-like flake shape. Herein, the plate-like flake shape may have a major axis and a minor axis. In detail, the plate-like flake shape may have different lengths on the major and minor axes. In detail, a ratio of the major axis to the minor axis of the plate-like flake shape may be 1:1.2 to 1:6. More specifically, the ratio of the major axis to the minor axis of the plate-like flake shape may be 1:1.2 to 1:2.5.

Figure 3:
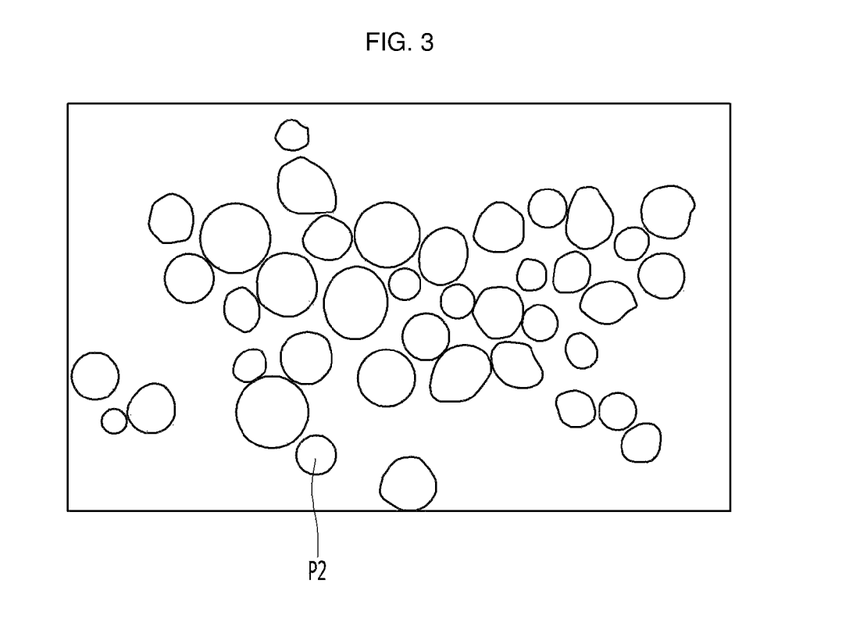
FIG. 3 is a view illustrating a shape of a second powder according to an embodiment.

In addition, the second powder P2 may be formed in a shape different from the plate-like flake shape. For example, the second powder P2 may have a spherical shape, that is, a ball shape, as shown in FIG. 3.

The thermoelectric powder may be subjected to a rapid solidification process when it is manufactured. The thermoelectric powder may be produced in a shape different from the plate-like flake shaped thermoelectric powder by such a cooling process, but composition and composition ratio thereof are the same as those of the plate-like flake-shaped thermoelectric powder.

Figure 4:
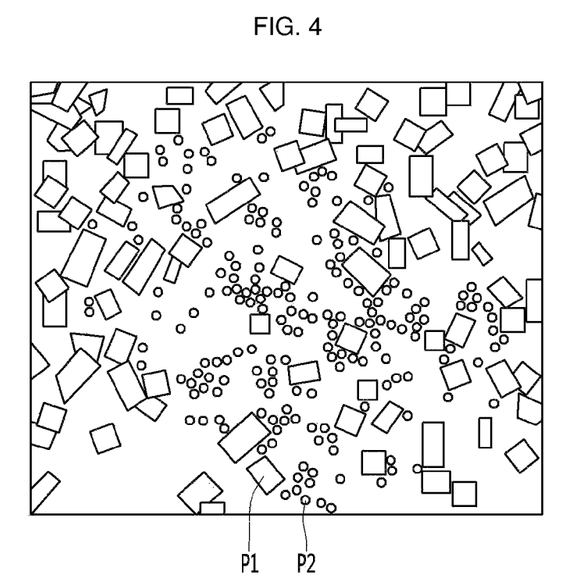
FIG. 4 is a view illustrating thermoelectric powder in which first and second powders are mixed.

In detail, as shown in FIG. 4, thermoelectric powder in which a plurality of unit powders having the same composition and composition ratio but different shapes are mixed may be produced.

The plate-like flake-shaped thermoelectric powder and the thermoelectric powder having a shape different from the plate-like flake-shaped thermoelectric powder may have different lattice constants from each other, and when the plate-like flake-shaped thermoelectric powder and the thermoelectric powder having a shape different from the plate-like flake-shaped thermoelectric powder are sintered together, thermoelectric performance of a thermoelectric sintered body may be deteriorated due to an increase in resistance or the like.

Accordingly, the first powder P1 and the second powder P2 are filtered in the second region 2A of the powder control unit 1000, and the thermoelectric powder in which all or most of the second powder P2 is removed may be moved to the powder sintering unit 2000. That is, most of the thermoelectric powder moved to the powder sintering unit 2000 may be the first powder P1.

As described above, the shapes of the first powder P1 and the second powder P2 may be different from each other. That is, particle sizes of the first powder P1 and the second powder P2 may be different from each other. In detail, the particle size of the first powder P1 may be larger than that of the second powder P2. In detail, the first powder P1 may be formed in a plate-like flake shape, and the second powder P2 may be formed in a ball shape.

Figure 5:
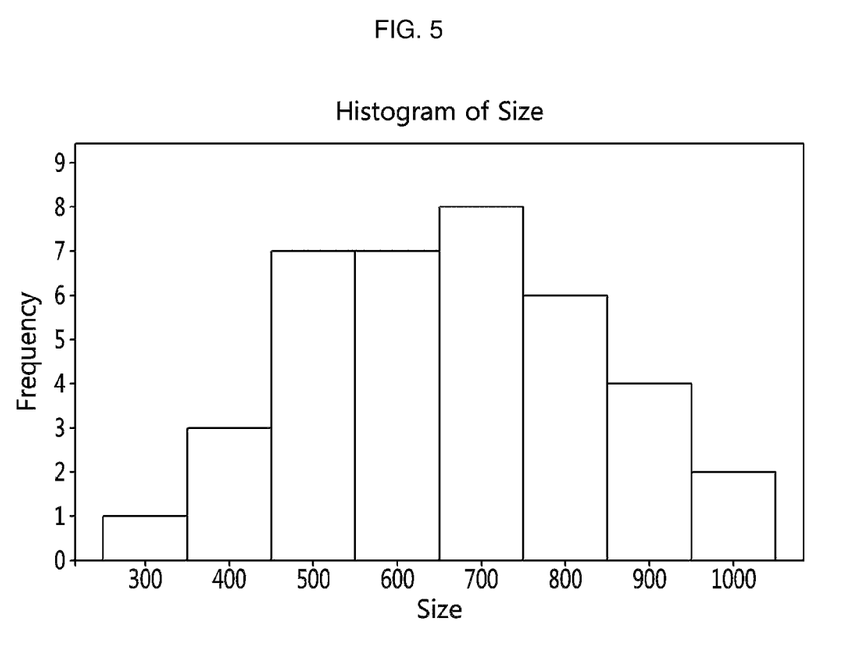
FIG. 5 is a view illustrating a particle size distribution of a first powder according to an embodiment.

In addition, the particle size of the second powder P2 may be about 300 μm to about 1100 μm. Further, an average particle size of the second powder P2 may be about 650 μm to about 670 μm. In detail, as shown in FIG. 5, the particle size of the second powder P2 may have a range from about 300 μm to about 1100 μm, and in this case, the particle size of the second powder P2 having a particle size of about 650 μm to about 670 μm may include the largest amount.

The first filter portion F1 disposed between the first 'region 1A' and the second 'region 2A' may separate the first powder P1 and the second powder P2. That is, the second powder P2 having a relatively small particle size through the hole of the first filter portion F1 may be moved to the second 'region 2A' through the hole, and the first powder P1 may be remained in the first 'region 1A'.

In detail, a vibration may be applied to the powder control unit 1000 through the external control member 3000. In detail, a vibration member 1500 may be operated by the control member 3000, and the vibration member 1500 may apply the vibration to the control region 2A. That is, the vibration member 1500 may apply the vibration to the first 'region 1A', the second 'region 2A' and the third 'region 3A'.

The vibration applied to the control region 2A is be transmitted to the vibration portion 1200, and the vibration portion 1200 moves upward and downward, and it is possible to apply the vibration to the first powder P1, the second powder P2, and the first filter portion F1. In detail, the vibration may be applied to the first filter portion F1 at a first frequency.

Accordingly, while the first powder P1 and the second powder P2 are moved in a vertical direction by the vibration of the first frequency, the first powder P1 may be remained in the first 'region 1A' through the first filter portion F1, and only the second powder P2 may be moved to the second 'region 2A'.

The second filter portion F2 may move the second powder P2 moved to the second 'region 2A' to the third 'region 3A'.

In detail, the vibration is applied to the powder control unit 1000 through the control member 3000, and the vibration member 1500 is operated by the control member 3000, and the vibration member 1500 may apply the vibration to the control region 2A. The vibration applied to the control region 2A is transmitted to the vibration portion 1200, and the vibration portion 1200 moves upward and downward, and it is possible to apply the vibration to the first powder P1, the second powder P2, and the second filter portion F2. In detail, the vibration may be applied to the second filter portion F2 at a second frequency. In this case, the second frequency may be larger than the first frequency.

Accordingly, the second powder P2 may be moved from the second 'region 2A' to the third region 3A', and the second powder P2 may be collected in the third 'region 3A'. The second powder P2 collected in the third 'region 3A' may be exhausted through the outside.

In addition, the first powder P1 remained in the first 'region 1A' may be pulverized by a second vibration of the second frequency magnitude. Accordingly, the uniformity of the overall particle size of the first powder P1 may be improved.

The pulverized and sieved powder in the control region 2A may be moved to the supply region 3A. In detail, the first powders P1 of the first 'region 1A' of the control region 2A may be moved to the supply region 3A.

That is, in the control region 2A, the shape and particle size of the powder injected in the input region 1A may be controlled. In detail, the shape of the thermoelectric powder may be filtered to the first powder having a plate-like flake shape by the control region 2A, and the uniformity of the particle size of the plate-like flake shape may be improved.

In detail, the second powder, that is, the ball-shaped thermoelectric powder, that causes a decrease in the electrical conductivity in the thermoelectric powder may be removed through the first filter portion and the second filter portion, and thus the shape uniformity of the thermoelectric powder moved to a sintering region may be improved, and the thermoelectric characteristics of the thermoelectric sintered body sintered in the sintering region may be improved. That is, the second powder having a shape and a lattice constant different from those of the first powder may affect an arrangement of the first powder, and thus cracks or voids may occur inside the finally manufactured thermoelectric sintered body, thereby decreasing the electrical conductivity of a P-type thermoelectric leg and an N-type thermoelectric leg manufactured by the thermoelectric sintered body.

In this case, the voids of the thermoelectric sintered body manufactured by the thermoelectric powder according to an embodiment may be about 5% or less of the entire area of the thermoelectric sintered body.

However, the thermoelectric sintered body according to an embodiment may minimize the decrease of the electrical conductivity due to the second powder by minimizing the second powder having a shape and lattice constant different from those of the first powder, thereby improving the thermoelectric characteristics of the thermoelectric leg.

In addition, the first powder may be pulverized at a predetermined size through the vibration applied to the control region, thereby improving the uniformity of the particle size of the first powder.

In the powder sintering unit 2000, powders sieved or pulverized in the powder control unit 1000 may be moved.

In detail, the powder sintering unit 2000 may form the thermoelectric sintered body by sintering powders sieved or pulverized in the powder control unit 1000.

The powder sintering unit 2000 may include a collecting member 2100, a sieve member 2200, a mold member 2300, and a driving member 2400.

In the collecting member 2100, the powders sieved or pulverized in the powder control unit 1000 may be moved. In detail, the powder sieved and pulverized in the control region 2A of the powder control unit 1000 may be moved to the collecting member 2100 of the powder sintering unit 2000 through the supply region.

That is, the powder moved to the collecting member 2100 may be the first powder P1, that is, the plate-like flake-shaped thermoelectric powder. That is, the powder moved to the collecting member 2100 may include the second powder P2, that is, the thermoelectric powder in which the ball-shaped thermoelectric powder causing a decrease in electrical conductivity is removed.

The powder moved to the collecting member 2100 may be moved to the sieve member 2200. The sieve member 2200 may include a plurality of sieve portions. In detail, the sieve member 2200 may include a first sieve portion 2210, a second sieve portion 2220, a third sieve portion 2230, and a fourth sieve portion 2240.

The first sieve portion 2210, the second sieve portion 2220, the third sieve portion 2230, and the fourth sieve portion 2240 may be formed in a mesh shape. In detail, the first sieve portion 2210, the second sieve portion 2220, the third sieve portion 2230, and the fourth sieve portion 2240 may include a mesh line and a mesh opening formed by the mesh line.

Sizes of the mesh openings of the first sieve portion 2210, the second sieve portion 2220, the third sieve portion 2230, and the fourth sieve portion 2240 may be changed depending on the particle size and shape of the powder.

The powder of the collecting member 2100 may be moved to the mold member 2300 through the sieve member 2200. The sieve member 2200 may control the directionality of the powder moving to the mold member 2300.

In detail, the sieve member 2200 may control the ribbon shape, that is, the plate-like flake-shaped powder to be disposed inside the mold member 2300 in one direction.

Figure 6:
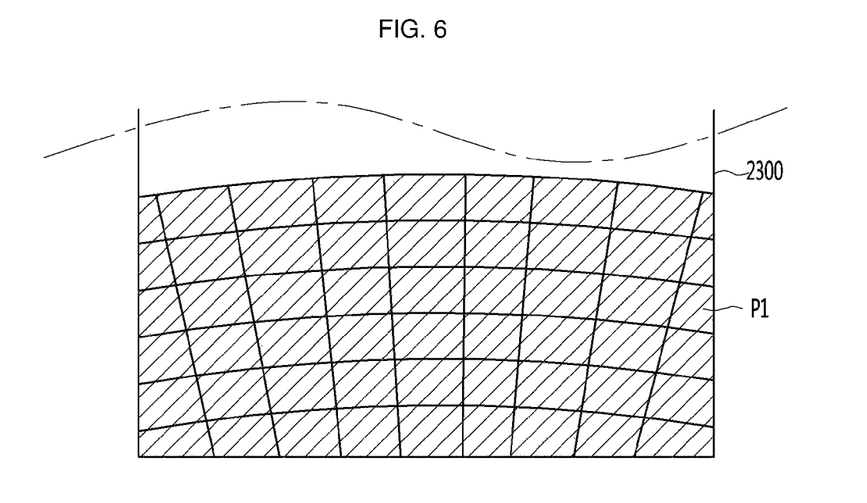
FIG. 6 is a view illustrating a structure in which thermoelectric powder is disposed in a mold member in a thermoelectric sintered body manufacturing apparatus according to an embodiment.

Referring to FIG. 6, the first powders P1 may be disposed in a first direction in a receiving portion, that is, inside the mold member 2300. That is, the first powders P1 may be disposed in a horizontal direction inside the mold member 2300. That is, most of the first powders P1 disposed inside the mold member 2300 may be disposed in the horizontal direction, and may fill the mold member 2300.

In this case, the horizontal direction may refer to a direction having a vertical component with reference to the gravity direction. In addition, the horizontal direction may also include a direction in which a major axis of the plate-like flake is inclined at an angle of within ±15° with respect to a virtual vertical line of the gravity direction.

That is, the horizontal direction may be defined as a direction having a horizontal component with a bottom surface of the receiving portion, that is, a bottom surface of the mold member 2300 and a direction inclined at an angle of within ±15° with respect to the bottom surface.

For example, the first powder disposed in the horizontal direction inside the mold member 2300 may be about 95 vol % or more of the entire first powder. In detail, the first powder disposed in the horizontal direction inside the mold member 2300 may be about 95 vol % to about 100 vol % of the entire first powder. More specifically, the first powder disposed in the horizontal direction inside the mold member 2300 may be about 96 vol % to about 99 vol % of the entire first powder.

Subsequently, the mold member 2300 may be sintered through the driving member 2400 or the like. In detail, the driving member 2400 may include a rotation unit 2410, a motor unit 2420, and a pressure unit 2430, and the mold member 2300 may be sintered while being rotated by the driving member 2400.

For example, the mold member 2300 may be sintered for about 1 minute to about 30 minutes under conditions of about 400° C. to about 550° C. and about 35 MPa to about 60 MPa by using a spark plasma sintering (SPS) machine, or may be sintered for about 1 minute to about 60 minutes under conditions of about 400° C. to about 550° C. and about 180 MPa to about 250 MPa by using a hot-press machine.

The thermoelectric sintered body manufactured according to the above may be cut through a cutting process, and a thermoelectric leg which is finally applied to the thermoelectric element may be manufactured.

FIG. 6 is a view illustrating a photograph of a thermoelectric powder sintered body sintered by a thermoelectric powder sintering apparatus according to an embodiment.

Referring to FIG. 6, it may be seen that an arrangement of powders of the thermoelectric powder sintered body is mostly disposed in one direction. That is, it may be seen that the powders are disposed in one direction of the horizontal direction. In this case, the powder of the sintered body may refer to a crystal grain after sintering.

Accordingly, thermal conductivity of the thermoelectric powder sintered body may be decreased and electrical conductivity may be improved. Thus, thermoelectric performance of the thermoelectric leg may be improved when the thermoelectric powder sintered body is applied to the thermoelectric leg of the thermoelectric element.

In addition, an amount of the second powder that causes a decrease in the electrical conductivity, that is, the powder having a shape different from the plate-like flake shape, may be reduced in the thermoelectric powder control unit, thereby improving the thermoelectric performance of the thermoelectric leg after sintering thermoelectric powder. In detail, the second powder that causes a decrease in the electrical conductivity in the thermoelectric powder sintered body may be about 5 vol % or less of the entire powder. More specifically, the second powder that causes a decrease in the electrical conductivity in the thermoelectric powder sintered body may be about 3 vol % or less of the entire powder. More specifically, the second powder that causes a decrease in the electrical conductivity in the thermoelectric powder sintered body may be about 1 vol % or less of the entire powder.

Hereinafter, the present invention will be described in more detail with reference to a method of manufacturing thermoelectric powders according to Exemplary Embodiments and Comparative Examples. These embodiments are merely illustrative examples in order to describe the present invention in more detail. Therefore, the present invention is not limited to these embodiments.

Exemplary Embodiment 1

A thermoelectric material was thermally treated to manufacture an ingot, and then the ingot was pulverized and sieved to obtain thermoelectric leg powder.

Then, the thermoelectric leg powder was sintered, and a P-type thermoelectric leg and an N-type thermoelectric leg were manufactured by cutting the sintered body.

At this time, the thermoelectric leg powder included 0.1 vol % of a ball-shaped powder together with a plate-like flake-shaped powder.

Then, electrical conductivities of the P-type thermoelectric leg and the N-type thermoelectric leg were measured.

Exemplary Embodiment 2

The P-type thermoelectric leg and the N-type thermoelectric leg were manufactured in the same manner as in Example 1, except that the plate-like flake-shaped powder and the ball-shaped powder were included in the ball-shaped powder, and the ball-shaped powder was included at about 0.5 vol % of the entire thermoelectric leg powder, and then the electrical conductivities of the P-type thermoelectric leg and the N-type thermoelectric leg were measured.

Exemplary Embodiment 3

The P-type thermoelectric leg and the N-type thermoelectric leg were manufactured in the same manner as in Example 1, except that the ball-shaped powder was included at about 1.0 vol % of the entire thermoelectric leg powder, and then the electrical conductivities of the P-type thermoelectric leg and the N-type thermoelectric leg were measured.

Exemplary Embodiment 4

The P-type thermoelectric leg and the N-type thermoelectric leg were manufactured in the same manner as in Example 1, except that the ball-shaped powder was included at about 2.0 vol % of the entire thermoelectric leg powder, and then the electrical conductivities of the P-type thermoelectric leg and the N-type thermoelectric leg were measured.

Exemplary Embodiment 5

The P-type thermoelectric leg and the N-type thermoelectric leg were manufactured in the same manner as in Example 1, except that the ball-shaped powder was included at about 3.0 vol % of the entire thermoelectric leg powder, and then the electrical conductivities of the P-type thermoelectric leg and the N-type thermoelectric leg were measured.

Exemplary Embodiment 6

The P-type thermoelectric leg and the N-type thermoelectric leg were manufactured in the same manner as in Example 1, except that the ball-shaped powder was included at about 4.0 vol % of the entire thermoelectric leg powder, and then the electrical conductivities of the P-type thermoelectric leg and the N-type thermoelectric leg were measured.

Exemplary Embodiment 7

The P-type thermoelectric leg and the N-type thermoelectric leg were manufactured in the same manner as in Example 1, except that the ball-shaped powder was included at about 5.0 vol % of the entire thermoelectric leg powder, and then the electrical conductivities of the P-type thermoelectric leg and the N-type thermoelectric leg were measured.

Exemplary Embodiment 8

The P-type thermoelectric leg and the N-type thermoelectric leg were manufactured in the same manner as in Example 1, except that the ball-shaped powder was included at about 6.0 vol % of the entire thermoelectric leg powder, and then the electrical conductivities of the P-type thermoelectric leg and the N-type thermoelectric leg were measured.

Comparative Example

A thermoelectric material was thermally treated to manufacture an ingot, and then the ingot was pulverized without sieving to obtain thermoelectric leg powder.

At this time, the ball-shaped powder was included at about 7.0 vol % of the entire thermoelectric leg powder, and the P-type thermoelectric leg and the N-type thermoelectric leg were manufactured in the same manner as in Example 1, and then the electrical conductivities of the P-type thermoelectric leg and the N-type thermoelectric leg were measured.

TABLE 1

|  | P-type thermoelectric leg electrical conductivity (S/cm) | N-type thermoelectric leg electrical conductivity (S/cm) |
| --- | --- | --- |
| Exemplary Embodiment 1 | 1106 | 806 |
| Exemplary Embodiment 2 | 1106 | 806 |
| Exemplary Embodiment 3 | 1101 | 803 |
| Exemplary Embodiment 4 | 1092 | 792 |
| Exemplary Embodiment 5 | 1077 | 770 |

TABLE 1-continued

| | P-type thermo-electric leg electrical conductivity (S/cm) | N-type thermo-electric leg electrical conductivity (S/cm) |
|---|---|---|
| Exemplary Embodiment 6 | 1063 | 764 |
| Exemplary Embodiment 7 | 1041 | 759 |
| Exemplary Embodiment 8 | 989 | 712 |
| Comparative Example | 920 | 677 |

Referring to Table 1, it may be seen that thermoelectric legs according to Exemplary Embodiments 2 to 6 have a small difference in electrical conductivity as compared with the thermoelectric leg according to Exemplary Embodiment 1, that is, a thermoelectric leg including a small amount of ball-shaped powder.

That is, it may be seen that a thermoelectric leg including 0.1 to 6.0 vol % of the ball-shaped powder has a slight difference in electrical conductivity within about 5% as compared with the thermoelectric leg including a small amount of the ball-shaped powder.

However, it may be seen that thermoelectric legs according to Exemplary Embodiments 7 and 8, and Comparative Example have a large difference in electrical conductivity as compared with the thermoelectric leg according to Exemplary Embodiment 1, that is, the thermoelectric leg including a small amount of the ball-shaped powder.

That is, it may be seen that a thermoelectric leg including 5.0 vol % or more of the ball-shaped powder has a large difference in electrical conductivity of about 5% or more as compared with a thermoelectric leg without the ball-shaped powder.

That is, ball-shaped powders according to Exemplary Embodiments 7 and 8, and Comparative Example are mixed together with plate-like flake-shaped powder, and voids or cracks are formed in a sintered body, and thus it may be seen that electrical conductivity of a thermoelectric leg manufactured was greatly reduced.

Hereinafter, one example of a thermoelectric element to which a thermoelectric sintered body manufactured by a thermoelectric sintered body manufacturing apparatus according to an embodiment is applied will be described with reference to FIGS. 7 to 9.

Figure 7:
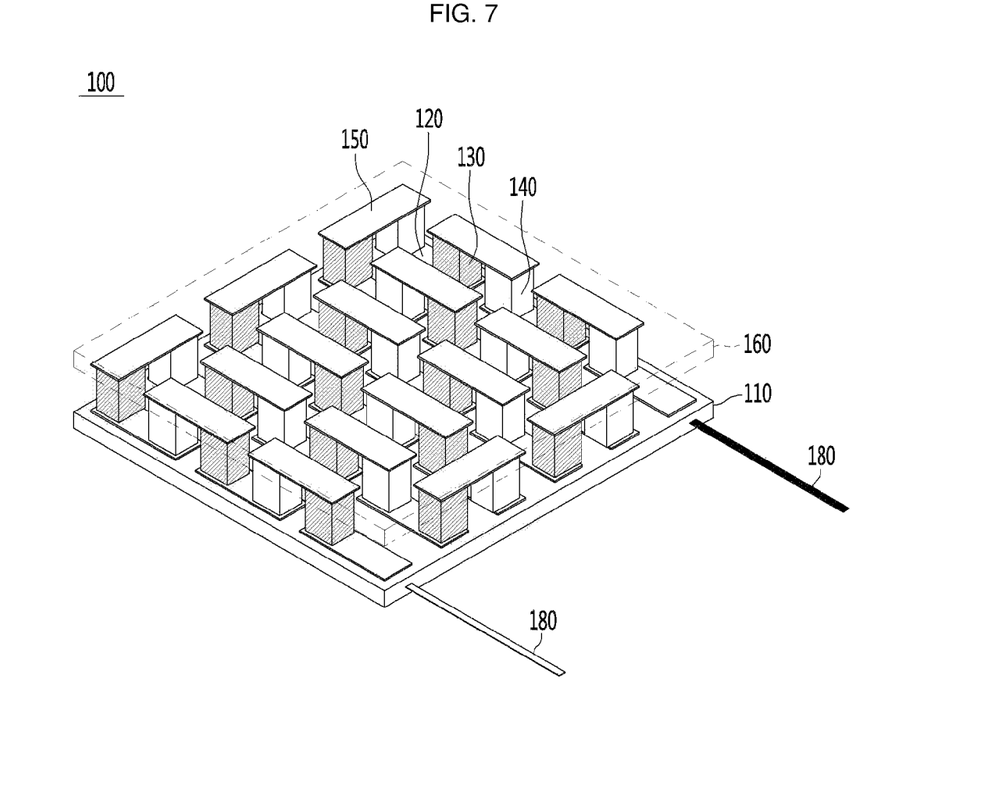
FIG. 7 is a perspective view of a thermoelectric element including a thermoelectric sintered body according to an embodiment.
Figure 8:
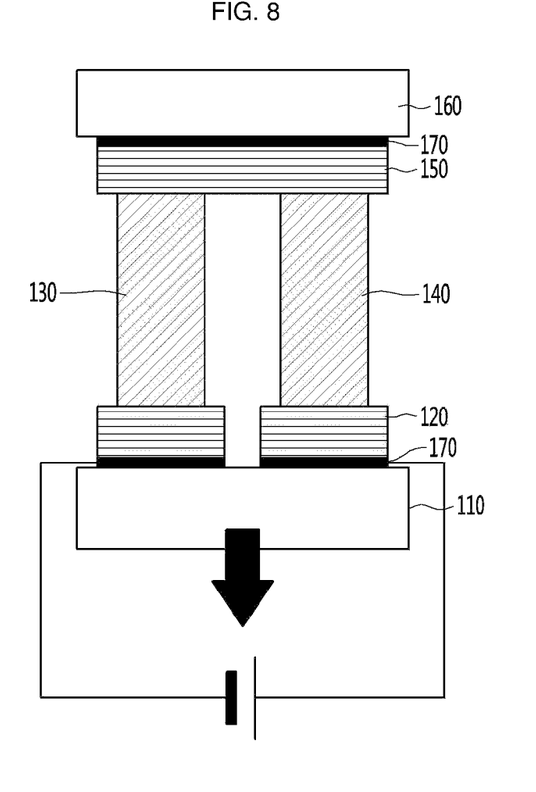
FIG. 8 is one cross-sectional view of a thermoelectric element including a thermoelectric sintered body according to an embodiment.
Figure 9:
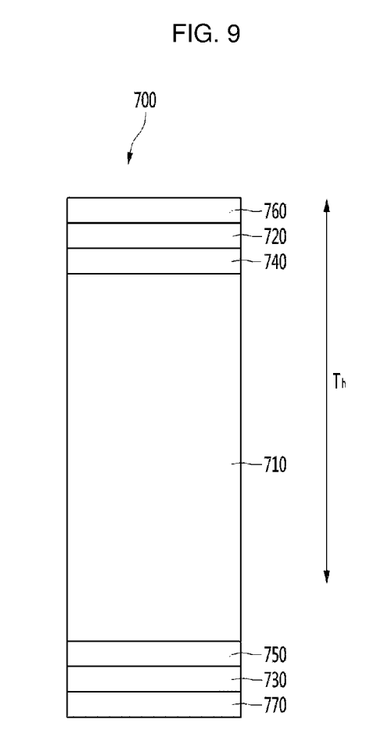
FIG. 9 is a cross-sectional view illustrating one embodiment of a thermoelectric leg according to an embodiment.

Referring to FIGS. 7 to 9, a thermoelectric element 100 may include a lower substrate 110, a lower electrode 120, a P-type thermoelectric leg 130, an N-type thermoelectric leg 140, an upper electrode 150, and an upper substrate 160.

The lower electrode 120 may be disposed between the lower substrate 110 and lower bottom surfaces of the P-type thermoelectric leg 130 and the N-type thermoelectric leg 140. The upper electrode 150 may be disposed between the upper substrate 160 and upper bottom surfaces of the P-type thermoelectric leg 130 and the N-type thermoelectric leg 140.

Accordingly, a plurality of P-type thermoelectric legs 130 and a plurality of N-type thermoelectric legs 140 may be electrically connected by the lower electrode 120 and the upper electrode 150. A pair of P-type thermoelectric leg 130 and N-type thermoelectric leg 140, which are disposed between the lower electrode 120 and the upper electrode 150 and are electrically connected to each other, may form a unit cell.

For example, when a voltage is applied to the lower electrode 120 and the upper electrode 150 through lead wires 181 and 182, a substrate in which a current flows from the P-type thermoelectric leg 130 to the N-type thermoelectric leg 140 may absorb heat to act as a cooling portion due to the Peltier effect, and a substrate in which a current flows from the N-type thermoelectric leg 140 to the P-type thermoelectric leg 130 may be heated to act as a heat generating portion.

Here, the P-type thermoelectric leg 130 and the N-type thermoelectric leg 140 may be bismuth telluride (Bi—Te)-based thermoelectric legs including bismuth (Bi) and tellurium (Ti) as main raw materials.

The P-type thermoelectric leg 130 may be a thermoelectric leg including 99 wt % to 99.999 wt % of a bismuth telluride (Bi—Te)-based main raw material containing at least one of antimony (Sb), nickel (Ni), aluminum (Al), copper (Cu), silver (Ag), lead (Pb), boron (B), gallium (Ga), tellurium (Te), bismuth (Bi), and indium (In) and 0.001 wt % to 1 wt % of a mixture containing Bi or Te, based on 100 wt % of the total weight. For example, the P-type thermoelectric leg 130 may include Bi—Se—Te as a main raw material, and may further include 0.001 wt % to 1 wt % of Bi or Te of the total weight.

The N-type thermoelectric leg 140 may be a thermoelectric leg including 99 wt % to 99.999 wt % of a bismuth telluride (Bi—Te)-based main raw material containing at least one of selenium (Se), nickel (Ni), aluminum (Al), copper (Cu), silver (Ag), lead (Pb), boron (B), gallium (Ga), tellurium (Te), bismuth (Bi), and indium (In) and 0.001 wt % to 1 wt % of a mixture containing Bi or Te, based on 100 wt % of the total weight. For example, the N-type thermoelectric leg 140 may include Bi—Se—Te as a main raw material, and may further include 0.001 wt % to 1 wt % of Bi or Te of the total weight.

The P-type thermoelectric leg 130 and the N-type thermoelectric leg 140 may be formed in a bulk type or a stack type. Generally, a bulk type P-type thermoelectric leg 130 or a bulk type N-type thermoelectric leg 140 may be obtained through a process of heat-treating a thermoelectric material to manufacture an ingot, pulverizing and sieving the ingot to obtain powder for a thermoelectric leg, then sintering the powder, and cutting a sintered body. A stack type P-type thermoelectric leg 130 or a stack type N-type thermoelectric leg 140 may be obtained through a process of stacking and cutting a unit member after applying paste containing a thermoelectric material on a sheet-shaped base material to form the unit member.

Referring to FIG. 9, at least one thermoelectric leg 700 of the P-type thermoelectric leg 130 and the N-type thermoelectric leg 140 according to an embodiment includes a thermoelectric material layer 710, a first metal layer 760 and a second metal layer 770 respectively disposed on one surface of the thermoelectric material layer 710 and another surface opposite to the one surface, a first bonding layer 740 disposed between the thermoelectric material layer 710 and the first metal layer 760 and a second bonding layer 750 disposed between the thermoelectric material layer 710 and the second metal layer 770, and a first plating layer 720 disposed between the first metal layer 760 and the first bonding layer 740 and a second plating layer 730 disposed between the second metal layer 770 and the second bonding layer 750. At this time, the thermoelectric material layer 710 and the first bonding layer 740 may be in direct contact with each other, and the thermoelectric material layer 710 and the second bonding layer 750 may be in direct contact with each other. In addition, the first bonding layer 740 and the first plating layer 720 may be in direct contact with each other, and the second bonding layer 750 and the second plating layer 730 may be in direct contact with each other. Further, the first plating layer 720 and the first metal layer 760 may be in direct contact with each other, and the second plating layer 730 and the second metal layer 770 may be in direct contact with each other.

The thermoelectric material layer 710 may include bismuth (Bi) and tellurium (Te) which are semiconductor materials. The thermoelectric material layer 710 may have the same material or shape as the P-type thermoelectric leg 130 or the N-type thermoelectric leg 140.

In addition, the first metal layer 760 and the second metal layer 770 may be selected from copper (Cu), a copper alloy, aluminum (Al), and an aluminum alloy, and may have a thickness of 0.1 to 0.5 mm, preferably 0.2 to 0.3 mm.

The first plating layer 720 and the second plating layer 730 may include at least one of Ni, Sn, Ti, Fe, Sb, Cr, and Mo, respectively, and may have a thickness of 1 to 20 µm, preferably 1 to 10 µm.

The first bonding layer 740 and the second bonding layer 750 may be disposed between the thermoelectric material layer 710 and the first plating layer 720 and between the thermoelectric material layer 710 and the second plating layer 730. In this case, the first bonding layer 740 and the second bonding layer 750 may include Te.

Accordingly, the Te content from a center face of the thermoelectric material layer 710 to an interface between the thermoelectric material layer 710 and the first bonding layer 740 is higher than the Bi content, and the Te content from the center face of the thermoelectric material layer 710 to an interface between the thermoelectric material layer 710 and the second bonding layer 750 is higher than the Bi content. In addition, the Te content from the center face of the thermoelectric material layer 710 to the interface between the thermoelectric material layer 710 and the first bonding layer 740 or the Te content from the center face of the thermoelectric material layer 710 to the interface between the thermoelectric material layer 710 and the second bonding layer 750 may be 0.8 to 1 time the Te content of the center face of the thermoelectric material layer 710.

In this case, the pair of the P-type thermoelectric leg 130 and the N-type thermoelectric leg 140 may have the same shape and volume, or may have different shapes and volumes. For example, since the electrical conduction characteristics of the P-type thermoelectric leg 130 and the N-type thermoelectric leg 140 are different from each other, a height or cross-sectional area of the N-type thermoelectric leg 140 may be formed to be different from a height or cross-sectional area of the P-type thermoelectric leg 130.

Performance of the thermoelectric element according to one embodiment of the present invention may be expressed in a Seebeck index ZT. The Seebeck index ZT may be expressed as Equation 1.

$$ZT = \alpha^2 \cdot \sigma \cdot T/k \qquad \text{Equation 1}$$

Here, $\alpha$ is a Seebeck coefficient [V/K], $\sigma$ is electrical conductivity [S/m], and $\alpha^2\sigma$ is a power factor (W/mK2). In addition, T is a temperature, and k is thermal conductivity [W/mK]. k may be expressed as $a \cdot cp \cdot \rho$, wherein a is a thermal diffusivity [cm2/S], cp is a specific heat [J/gK], and $\rho$ is a density [g/cm3].

In order to obtain the Seebeck index of the thermoelectric element, a Z value (V/K) may be measured using a Z meter, and the Seebeck index ZT may be calculated using the measured Z value.

Here, the lower substrate 110 and the lower electrode 120 disposed between the P-type thermoelectric leg 130 and the N-type thermoelectric leg 140, and the upper substrate 160 and the upper electrode 150 disposed between the P-type thermoelectric leg 130 and the N-type thermoelectric leg 140 may include at least one of copper (Cu), silver (Ag), and nickel (Ni), and may have a thickness of 0.01 to 0.3 mm.

When the thickness of the lower electrode 120 or the upper electrode 150 is less than 0.01 mm, a function as an electrode may be deteriorated, and thus electric conduction performance may be lowered, and when the thickness exceeds 0.3 mm, conduction efficiency may be lowered due to an increase in resistance.

In addition, the lower substrate 110 and the upper substrate 160, which are opposed to each other, may be an insulating substrate or a metal substrate.

The insulating substrate may be an alumina substrate or a flexible polymer resin substrate. The flexible polymer resin substrate may include various insulating resin materials such as polyimide (PI), polystyrene (PS), polymethyl methacrylate (PMMA), cyclic olefin copolymer (COC), polyethylene terephthalate (PET), highly permeable plastic such as resin, or the like.

The metal substrate may include Cu, a Cu alloy, or a Cu—Al alloy, and a thickness thereof may be 0.1 to 0.5 mm. When the thickness of the metal substrate is less than 0.1 mm or exceeds 0.5 mm, heat radiation characteristics or thermal conductivity may be excessively high, and thus the reliability of the thermoelectric element may be deteriorated.

In addition, when the lower substrate 110 and the upper substrate 160 are metal substrates, a dielectric layer 170 may be further disposed between the lower substrate 110 and the lower electrode 120 and between the upper substrate 160 and the upper electrode 150, respectively.

The dielectric layer 170 may include a material having thermal conductivity of 5 to 10 W/K, and may be formed to a thickness of 0.01 to 0.15 mm. When the thickness of the dielectric layer 170 is less than 0.01 mm, insulation efficiency or withstand voltage characteristics may be deteriorated, and when the thickness exceeds 0.15 mm, thermal conductivity may be lowered, and thus thermal efficiency may be lowered.

In this case, the lower substrate 110 and the upper substrate 160 may be formed to have different sizes. For example, a volume, thickness, or area of one of the lower substrate 110 and the upper substrate 160 may be formed to be greater than a volume, thickness, or area of the other one. Accordingly, heat absorption performance or heat radiation performance of the thermoelectric element may be enhanced.

In addition, a heat radiation pattern, for example, a concavo-convex pattern may be formed on a surface of at least one of the lower substrate 110 and the upper substrate 160. Accordingly, the heat radiation performance of the thermoelectric element may be enhanced. When the concavo-convex pattern is formed on a surface in contact with the P-type thermoelectric leg 130 or the N-type thermoelectric leg 140, bonding characteristics between the thermoelectric leg and the substrate may also be improved.

The thermoelectric element module may be applied to a power generation device, a cooling device, a heating device, and the like. In detail, the thermoelectric element module may be mainly applied to an optical communication module, a sensor, a medical instrument, a measuring instrument, an aerospace industry, a refrigerator, a chiller, a car ventilation sheet, a cup holder, a washing machine, a dryer, a wine cellar, a water purifier, a power supply for sensors, a thermopile, and the like.

Here, an example in which the thermoelectric element module is applied to a medical instrument, is a polymerase chain reaction (PCR) device. The PCR device is an equipment for amplifying DNA to determine the base sequence of DNA, and is a device that requires precise temperature control and thermal cycling. To this end, a thermoelectric element based on the Peltier effect may be applied.

Another example in which the thermoelectric element module is applied to a medical instrument, is a photodetector. Here, the photodetector includes an infrared/ultraviolet detector, a charge coupled device (CCD) sensor, an X-ray detector, and a thermoelectric thermal reference source (TTRS). A thermoelectric element based on the Peltier effect may be applied for cooling the photodetector. And thus, it is possible to prevent a wavelength change, an output decrease, and a resolution decrease due to a temperature rise inside the photodetector.

Still another example in which the thermoelectric element module is applied to a medical instrument, includes a field of immunoassay, a field of in vitro diagnostics, general temperature control and cooling systems, physical therapy, a liquid chiller system, and a field of blood/plasma temperature control, etc. And thus, it is possible to control a temperature precisely.

Still another example in which the thermoelectric element module is applied to a medical instrument, is an artificial heart. And thus, it is possible to supply power to the artificial heart.

An example in which the thermoelectric element module is applied to an aerospace industry, includes a star tracking system, a thermal imaging camera, an infrared/ultraviolet detector, a CCD sensor, a hubble space telescope, TTRS, and the like. And thus, it is possible to maintain a temperature of an image sensor.

Another example in which the thermoelectric element module is applied to the aerospace industry, includes a cooling device, a heater, a power generation device, and the like.

In addition, the thermoelectric element module may be applied to other industries for power generation, cooling, and heating.

Hereinbefore, embodiments have been described with reference to preferred embodiments of the present invention. However, it will be understood by those skilled in the art that various changes and modifications may be made therein without departing from the spirit and scope of the present invention defined in the following claims.

The invention claimed is:

1. A thermoelectric sintered body comprising:
thermoelectric powder that includes Bi, Te, Se and In,
wherein the thermoelectric powder is disposed in a horizontal direction, and includes a plurality of first powders having a plate-like flake shape and a plurality of second powders different in shape from the first powders, and
the second powders are included at 4 vol % or less of the entire thermoelectric powder that includes Bi, Te, Se and In,
wherein the horizontal direction includes a direction in which a major axis of the first powder having the plate-like flake shape is inclined at an angle of within ±15° with respect to a virtual vertical line of a gravity direction.

2. The thermoelectric sintered body of claim 1, wherein the first powder arranged in the horizontal direction among the first powders is 95 vol % or more of the entire thermoelectric powder.

3. The thermoelectric sintered body of claim 1, wherein the second powders are included at about 3 vol % or less of the entire thermoelectric powder.

4. The thermoelectric sintered body of claim 1, wherein the second powders are included at about 1 vol % or less of the entire thermoelectric powder.

5. The thermoelectric sintered body according to claim 1, wherein the second powder is formed in a ball shape.

6. The thermoelectric sintered body of claim 1, wherein a void in the thermoelectric sintered body is 5% or less of the entire area thereof.

7. The thermoelectric sintered body of claim 1, wherein the first powder having the plate-like flake shape includes the major axis and a minor axis, and a ratio of the major axis to the minor axis of the first powder is 1:1.2 to 1:6.

8. The thermoelectric sintered body of claim 1, wherein the first powder is disposed in the horizontal direction at about 95 vol % or more of the entire thermoelectric powder.

9. The thermoelectric sintered body of claim 1, wherein the particle size of the second powder has a range from 300 μm to 1100 μm, and in this case, the particle size of the second powder having a particle size of 650 μm to 670 μm includes the largest amount.

10. The thermoelectric sintered body of claim 1, wherein a particle size of the first powder is different from a particle size of the second powder.

11. The thermoelectric sintered body of claim 10, wherein the particle size of the first powder is larger than the particle size of the second powder.

12. The thermoelectric sintered body according to claim 10, wherein the particle sizes of the first powder are different from the particle sizes of the second powder.

13. The thermoelectric sintered body of claim 12, wherein an average particle size of the second powder is 650 μm to 670 μm.

14. The thermoelectric sintered body of claim 12, wherein an average particle size of the second powder is 300 μm to 1100 μm.

* * * * *